US012713765B2

(12) United States Patent
Zhang

(10) Patent No.: US 12,713,765 B2
(45) Date of Patent: Aug. 18, 2026

(54) DISPLAY PANEL AND DISPLAY DEVICE

(71) Applicant: Hubei Yangtze Industrial Innovation Center Of Advanced Display Co., Ltd., Wuhan (CN)

(72) Inventor: Guofeng Zhang, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 557 days.

(21) Appl. No.: 17/978,094

(22) Filed: Oct. 31, 2022

(65) Prior Publication Data

US 2023/0053039 A1 Feb. 16, 2023

Related U.S. Application Data

(63) Continuation of application No. 16/992,682, filed on Aug. 13, 2020, now Pat. No. 11,515,375.

(30) Foreign Application Priority Data

Jun. 30, 2020 (CN) ......................... 202010616754.5

(51) Int. Cl.
*H10K 59/121* (2023.01)
*G09G 3/3225* (2016.01)
(Continued)

(52) U.S. Cl.
CPC ....... *H10K 59/1213* (2023.02); *G09G 3/3225* (2013.01); *H10K 59/126* (2023.02); *H10K 59/131* (2023.02)

(58) Field of Classification Search
CPC ............. H10K 59/1213; H10K 59/126; H10K 59/131; H10K 59/12; H10K 59/65;
(Continued)

(56) References Cited

U.S. PATENT DOCUMENTS 9,306,190 B2 * 4/2016 Kim ..................... H10K 59/123
10,475,868 B2 * 11/2019 Park ..................... H10K 59/124
(Continued)

FOREIGN PATENT DOCUMENTS

| | | | |
|---|---|---|---|
| CN | 107302032 A | 10/2017 |
| CN | 109638078 A | 4/2019 |
| CN | 111129102 A | 5/2020 |

*Primary Examiner* — Tan N Tran
(74) *Attorney, Agent, or Firm* — Anova Law Group, PLLC

(57) ABSTRACT

The present disclosure provides a display panel, including a substrate, a pixel driving circuit, a planarization layer, and a display area. The planarization layer is arranged on a side of the pixel driving circuit away from the substrate. The planarization layer includes a first area and a second area. The first area and the second area are in a direction perpendicular to the substrate. A vertical distance from a surface of the first area away from the substrate to the substrate is greater than a vertical distance from a surface of the second area away from the substrate to the substrate. The display area includes a second light-shielding layer arranged between the substrate and the planarization layer. In the direction perpendicular to the substrate, a projection of the second light-shielding layer partially overlaps with a projection of the first area.

19 Claims, 13 Drawing Sheets

(51) Int. Cl.
*H10K 59/126* (2023.01)
*H10K 59/131* (2023.01)

(58) Field of Classification Search
CPC ......... G09G 3/3225; G09G 2300/0426; G09G 2300/0439; G09G 2300/0809; G09G 3/3233
See application file for complete search history.

(56) References Cited

U.S. PATENT DOCUMENTS

| | | | | |
|---|---|---|---|---|
| 10,962,850 | B1* | 3/2021 | Yang | G02F 1/136209 |
| 11,600,688 | B2* | 3/2023 | Park | H10K 59/1315 |
| 2018/0097047 | A1* | 4/2018 | Jung | H10K 59/124 |
| 2019/0363220 | A1* | 11/2019 | Kim | H10K 59/38 |
| 2022/0028954 | A1 | 1/2022 | Li et al. | |

* cited by examiner

DISPLAY PANEL AND DISPLAY DEVICE

CROSS-REFERENCE TO RELATED APPLICATIONS

This application is a continuation application of U.S. patent application Ser. No. 16/992,682, filed on Aug. 13, 2020, which claims the priority of Chinese Patent Application No. CN202010616754.5, filed on Jun. 30, 2020, the entire contents of all of which are incorporated herein by reference.

FIELD OF THE DISCLOSURE

The present disclosure generally relates to the field of display technologies and, in particular, relates to a display panel and a display device.

BACKGROUND

In a display device with an under-screen camera, laser is often used to remove light-emitting structure layers, such as red light-emitting structure layers, green light-emitting structure layers, blue light-emitting structure layers, etc., of pixels from some areas, to increase transmittance of a display area corresponding to the under-screen camera of the display device. To prevent the laser from affecting pixel structures in areas that do not need such removal, small-area laser needs to be used to remove light-emitting materials. This, however, results in lower manufacturing efficiency of the display device.

BRIEF SUMMARY OF THE DISCLOSURE

One aspect of the present disclosure provides a display panel, including a substrate, a pixel driving circuit, a planarization layer, and a display area. The planarization layer is arranged on a side of the pixel driving circuit away from the substrate. The planarization layer includes a first area and a second area. The first area and the second area are in a direction perpendicular to the substrate. A vertical distance from a surface of the first area away from the substrate to the substrate is greater than a vertical distance from a surface of the second area away from the substrate to the substrate. The display area includes a second light-shielding layer arranged between the substrate and the planarization layer. In the direction perpendicular to the substrate, a projection of the second light-shielding layer partially overlaps with a projection of the first area.

Another aspect of the present disclosure provides a display panel, including a substrate, a pixel driving circuit, a light-emitting structure layer, and a display area. The display area includes a first display area and a second display area. The first display area includes a first light-shielding layer. The second display area includes a third light-shielding layer. In a direction perpendicular to the substrate, a projection of the first light-shielding layer partially overlaps with a projection of the pixel driving circuit, and a projection of the third light-shielding layer partially overlaps with the projection of the pixel driving circuit.

Another aspect of the present disclosure provides a display device, including a display panel. The display panel includes a substrate, a pixel driving circuit, a planarization layer, and a display area. The planarization layer is arranged on a side of the pixel driving circuit away from the substrate. The planarization layer includes a first area and a second area. The first area and the second area are in a direction perpendicular to the substrate. A vertical distance from a surface of the first area away from the substrate to the substrate is greater than a vertical distance from a surface of the second area away from the substrate to the substrate. The display area includes a second light-shielding layer arranged between the substrate and the planarization layer. In the direction perpendicular to the substrate, a projection of the second light-shielding layer partially overlaps with a projection of the first area.

Other aspects of the present disclosure can be understood by those skilled in the art in light of the description, the claims, and the drawings of the present disclosure.

BRIEF DESCRIPTION OF THE DRAWINGS

To more clearly illustrate the technical solution of the present disclosure, the accompanying drawings used in the description of the disclosed embodiments are briefly described hereinafter. The following drawings are merely examples for illustrative purposes according to various disclosed embodiments and are not intended to limit the scope of the present disclosure. Other drawings may be derived from such drawings by a person with ordinary skill in the art without creative efforts.

DETAILED DESCRIPTION

Technical solutions of the present disclosure will be described with reference to the drawings. It will be appreciated that the described embodiments are part rather than all of the embodiments of the present disclosure. Other embodiments conceived by those having ordinary skills in the art on the basis of the described embodiments without inventive efforts should fall within the scope of the present disclosure.

Figure 1:
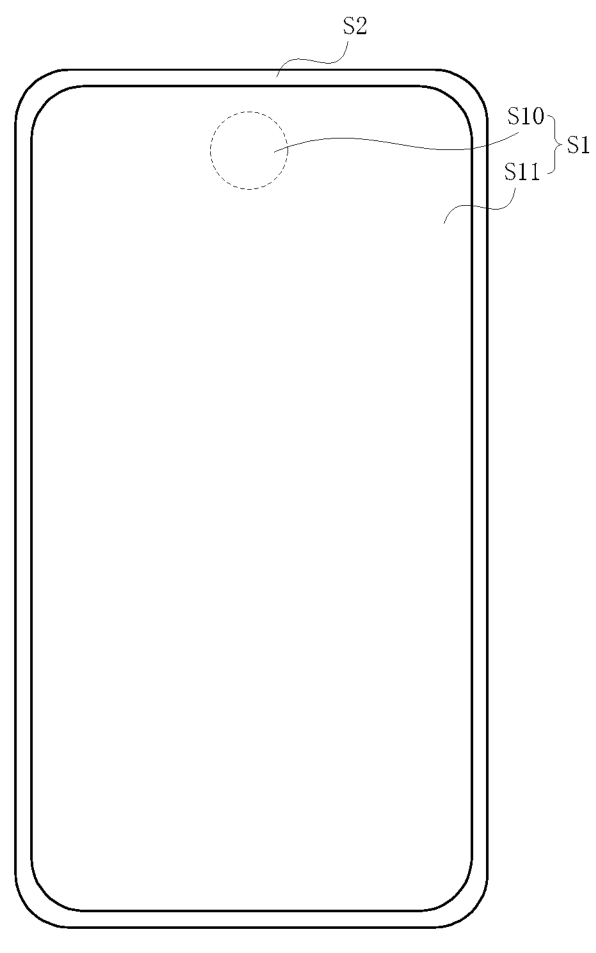
FIG. 1 is a top view schematic structural diagram of an exemplary display panel according to various embodiments of the present disclosure.

One embodiment of the present disclosure provides an exemplary display panel. FIG. 1 is a top view schematic structural diagram of an exemplary display panel according to various embodiments of the present disclosure. As shown in FIG. 1, an exemplary display panel includes a display area S1 and a non-display area S2. In other embodiments, the non-display area S2 may be optional. For example, the display panel may be a borderless display panel that does not include any non-display area S2, and only include the display area S1.

Referring to FIG. 1, the display area S1 includes a first display area S10 and a second display area S11, and the second display area S11 is disposed adjacent to the first display area S10. Optionally, as shown in FIG. 1, the second display area S11 is disposed surrounding the first display area S10, although the present disclosure is not limited thereto. In other embodiments, the first display area S10 may also be located on one side of the second display area S11, etc.

In one embodiment of the present disclosure, the first display area S10 is a display area corresponding to an under-screen camera. An under-screen camera means that the camera is located below a screen, which is a display panel. A shape and a position of the first display area S10 correspond to a shape and a position of the under-screen camera, so that external light penetrates through the first display area S10 and enters the under-screen camera for imaging, although the present disclosure is not limited thereto. In other embodiments, a display area that needs to use laser to remove film layers of a partial area may include the first display area S10 in the present disclosure.

Figure 2:
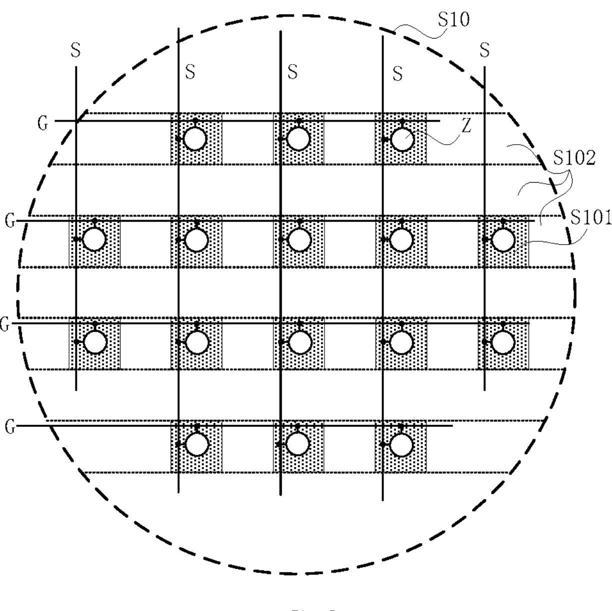
FIG. 2 is a schematic structural diagram of an exemplary first display area according to various embodiments of the present disclosure.

FIG. 2 is a schematic structural diagram of an exemplary first display area according to various embodiments of the present disclosure. As shown in FIG. 2, an exemplary first display area S10 includes light non-transmissive areas S101 and light transmissive areas S102. Optionally, the light transmissive areas S102 are located between adjacent light non-transmissive areas S101, and the light non-transmissive area S101 includes at least one sub-pixel Z, gate lines G and data lines S connected to the sub-pixel Z, etc. The gate lines G are used to input a scan signal to the sub-pixel Z and the data lines S are used to input a data signal to the sub-pixel Z, to control the sub-pixel Z to display images through the scan signal and the data signal.

In one embodiment of the present disclosure, the light transmissive areas S102 don't have sub-pixels, or the light transmissive areas S102 don't have full sub-pixels, e.g., sub-pixels of the light transmissive areas S102 don't have a light-emitting structure layer, so that light transmittance of the light transmissive areas S102 is greater than light transmittance of the light non-transmissive areas S101. Based on this, the light non-transmissive areas S101 can ensure that the first display area S10 can perform normal image display, and the light transmissive areas S102 can ensure sufficient light to penetrate through the first display area S10 and enter an under-screen camera for imaging.

Figure 3:
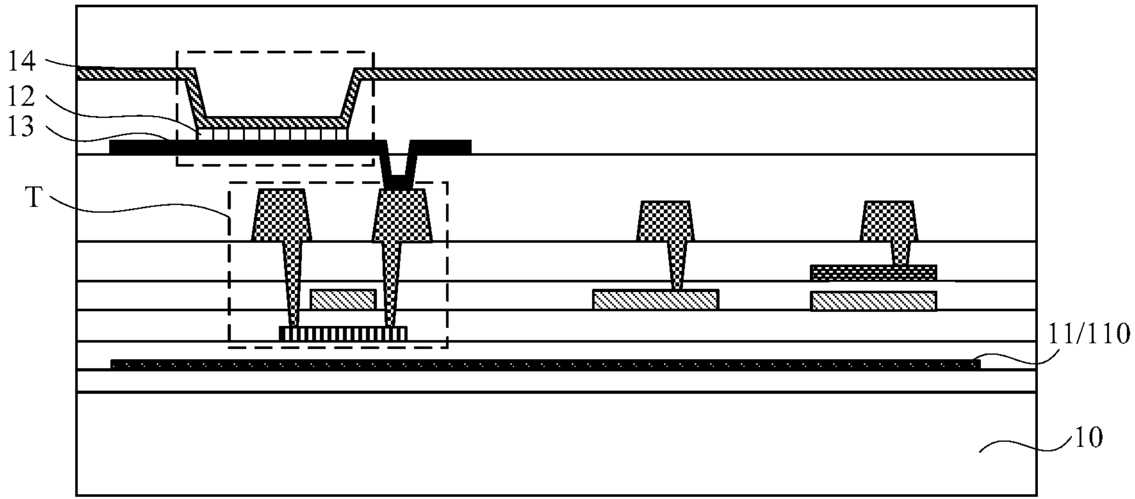
FIG. 3 is a cross-sectional view schematic structural diagram of an exemplary sub-pixel of an exemplary first display area according to various embodiments of the present disclosure.

FIG. 3 is a cross-sectional view schematic structural diagram of an exemplary sub-pixel of an exemplary first display area according to various embodiments of the present disclosure. As shown in FIG. 3, an exemplary sub-pixel includes a first light-shielding layer 11, a pixel driving circuit, and a light-emitting structure layer 12, which are sequentially disposed on a substrate 10. The pixel driving circuit at least includes a driving transistor T, an anode 13 is provided on one surface of the light-emitting structure layer 12, and a cathode 14 is provided on another surface of the light-emitting structure layer 12. Optionally, the light-emitting structure layer 12 is made of one of an organic light-emitting material and an inorganic light-emitting material. The anode 13 is connected to a drain of the driving transistor T, and the cathode 14 is connected to a common voltage terminal, to drive the light-emitting structure layer 12 to emit light through the driving transistor T.

In one embodiment of the present disclosure, in a direction perpendicular to the substrate 10, a projection of the first light-shielding layer 11 covers a projection of the light-emitting structure layer 12 and a projection of at least one transistor of the pixel driving circuit. The pixel driving circuit at least includes the driving transistor T and one other transistor. The at least one transistor covered by the projection of the first light-shielding layer 11 may include the driving transistor T or may not include the driving transistor T. In FIG. 3, the projection of the first light-shielding layer 11 covering a projection of the driving transistor T of the pixel driving circuit is only described as an example, although the present disclosure is not limited thereto.

In one embodiment of the present disclosure, to minimize influence of laser on the sub-pixel, the projection of the first light-shielding layer 11 can cover the projection of the light-emitting structure layer 12 and a projection of the entire pixel driving circuit. To reduce costs, the projection of the first light-shielding layer 11 may also only cover the projection of the light-emitting structure layer 12 and a projection of one or more transistors of the pixel driving circuit that are sensitive to laser light.

In one embodiment of the present disclosure, when manufacturing a display panel, the first light-shielding layer 11 is only formed in sub-pixels in light non-transmissive areas S101, and sub-pixels in light transmissive areas S102 don't have the first light-shielding layer 11. Accordingly, under light-shielding effect of the first light-shielding layer 11, incident laser from a side of the substrate 10 facing away from the first light-shielding layer 11 does not affect performance of the light-emitting structure layer 12 and the at least one transistor of the pixel driving circuit in the light non-transmissive areas S101. In this case, large-area laser can be used to irradiate the first display area S10 to improve production efficiency of the display panel, while removing the light-emitting structure layer 12 and other color film layers in the light transmissive areas S102, and making transmittance of the light transmissive areas S102 to meet imaging requirements of the under-screen camera.

In one embodiment of the present disclosure, the first light-shielding layer 11 at least includes a first sub-light-shielding layer 110, and the first sub-light-shielding layer 110 is made of a black light-shielding material. Optionally, the first sub-light-shielding layer 110 is made of a same material as a black matrix.

Figure 4:
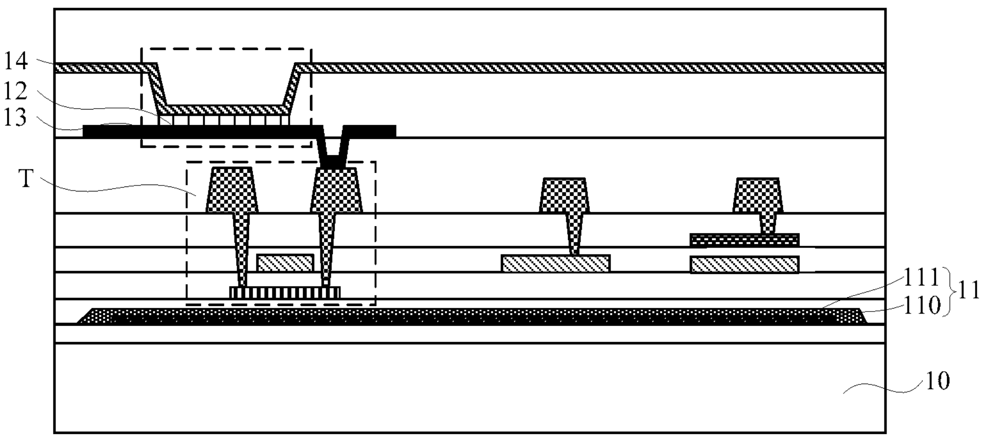
FIG. 4 is a cross-sectional view schematic structural diagram of an exemplary sub-pixel of an exemplary first display area according to various embodiments of the present disclosure.

As shown in FIG. 3, the first light-shielding layer 11 may include only the first sub-light-shielding layer 110, although the present disclosure is not limited thereto. FIG. 4 is a cross-sectional view schematic structural diagram of an exemplary sub-pixel of an exemplary first display area according to various embodiments of the present disclosure. In other embodiments, as shown in FIG. 4, a first light-shielding layer 11 may further include a second sub-light-shielding layer 111.

The second sub-light-shielding layer 111 and a first sub-light-shielding layer 110 are stacked one over another. The second sub-light-shielding layer 111 may be located on a top of the first sub-light-shielding layer 110 or at a bottom of the first sub-light-shielding layer 110. The second sub-light-shielding layer 111 needs to be in direct contact with the first sub-light-shielding layer 110, and in a direction perpendicular to a substrate 10, a projection of the second sub-light-shielding layer 111 and a projection of the first sub-light-shielding layer 110 at least partially overlap each other.

In addition, in one embodiment of the present disclosure, the second sub-light-shielding layer 111 is made of a metal material. Heat generated by the first sub-light-shielding layer 110 during laser irradiation can be balanced by the second sub-light-shielding layer 111 to avoid problems such as abnormal light emission of sub-pixels and reduced lifetime, caused by uneven heating of the sub-pixels because of the heat generated by the first sub-light-shielding layer 110.

In one embodiment of the present disclosure, the projection of the second sub-light-shielding layer 111 may completely overlap the projection of the first sub-light-shielding layer 110. As shown in FIG. 4, in the direction perpendicular to the substrate 10, the projection of the second sub-light-shielding layer 111 covers the projection of the first sub-light-shielding layer 110 and a projection of a predetermined area surrounding the first sub-light-shielding layer 110 to balance heat generated by the first sub-light-shielding layer 110 through the second sub-light-shielding layer 111, while shielding laser light to the predetermined area surrounding the first sub-light-shielding layer 110 through the second sub-light-shielding layer 111, to prevent laser from affecting structures in the predetermined area surrounding the first sub-light-shielding layer 110.

Figure 5:
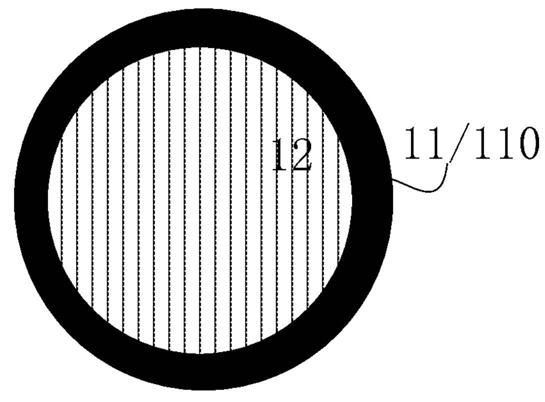
FIG. 5 is a top view schematic structural diagram of an exemplary light-emitting structure layer and an exemplary first light-shielding layer according to various embodiments of the present disclosure.

In one embodiment of the present disclosure, a shape of a projection of a light-emitting structure layer 12 in a direction perpendicular to a substrate 10 may be square or circular. When a shape of a projection of a light-emitting structure layer 12 is circular, a diffraction phenomenon may occur after laser light passes through gate lines G and data lines S arranged crosswise, and an annular halo may be formed around the light-emitting structure layer 12. FIG. 5 is a top view schematic structural diagram of an exemplary light-emitting structure layer and an exemplary first light-shielding layer according to various embodiments of the present disclosure. To avoid a halo from affecting a light-emitting structure layer 12 and structures surrounding the light-emitting structure layer 12, as shown in FIG. 5, in a direction perpendicular to a substrate 10, a projection of a first light-shielding layer 11 and a projection of the light-emitting structure layer 12, are concentric circles, and a radius of the projection of the first light-shielding layer 11 is a preset value d larger than a radius of the projection of the light-emitting structure layer 12. Optionally, a value of d ranges from about 2 um to about 20 um.

Optionally, as shown in FIG. 5, a projection of a first sub-light-shielding layer 110 and the projection of the light-emitting structure layer 12 are concentric circles, and a radius of the projection of the first sub-light-shielding layer 110 is a preset value d larger than the radius of the projection of the light-emitting structure layer 12. In the direction perpendicular to the substrate 10, the projection of the first sub-light-shielding layer 110 covers the projection of the light-emitting structure layer 12 and a projection of a predetermined area surrounding the light-emitting structure layer 12.

Figure 6:
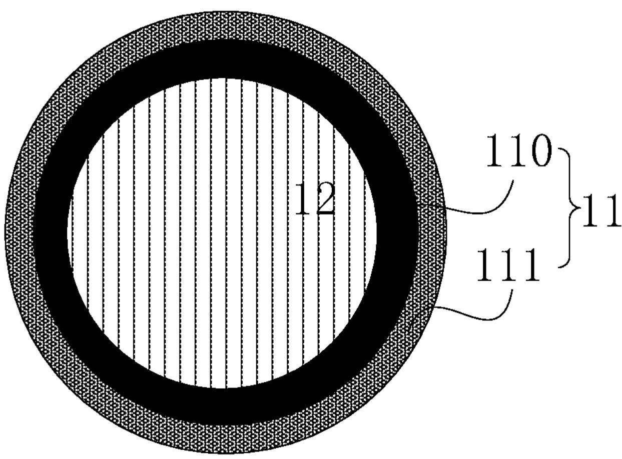
FIG. 6 is a top view schematic structural diagram of an exemplary light-emitting structure layer and an exemplary first light-shielding layer according to various embodiments of the present disclosure.

FIG. 6 is a top view schematic structural diagram of an exemplary light-emitting structure layer and an exemplary first light-shielding layer according to various embodiments of the present disclosure. As shown in FIG. 6, a projection of a first sub-light-shielding layer 110, a projection of a second sub-light-shielding layer 111, and a projection of a light-emitting structure layer 12, are concentric circles. A radius of the projection of the second sub-light-shielding layer 111 is a preset value larger than a radius of the projection of the first sub-light-shielding layer 110, and the radius of the projection of the first sub-light-shielding layer 110 is a preset value larger than a radius of the projection of the light-emitting structure layer 12. In a direction perpendicular to a substrate 10, the projection of the second sub-light-shielding layer 111 covers the projection of the first sub-light-shielding layer 110 and a projection of a predetermined area surrounding the first sub-light-shielding layer 110, and the projection of the first sub-light-shielding layer 110 covers the projection of the light-emitting structure layer 12 and a projection of a predetermined area surrounding the light-emitting structure layer 12, thereby further reducing influence of a halo to the light-emitting structure layer 12 and the predetermined area surrounding the light-emitting structure layer 12.

Figure 7:
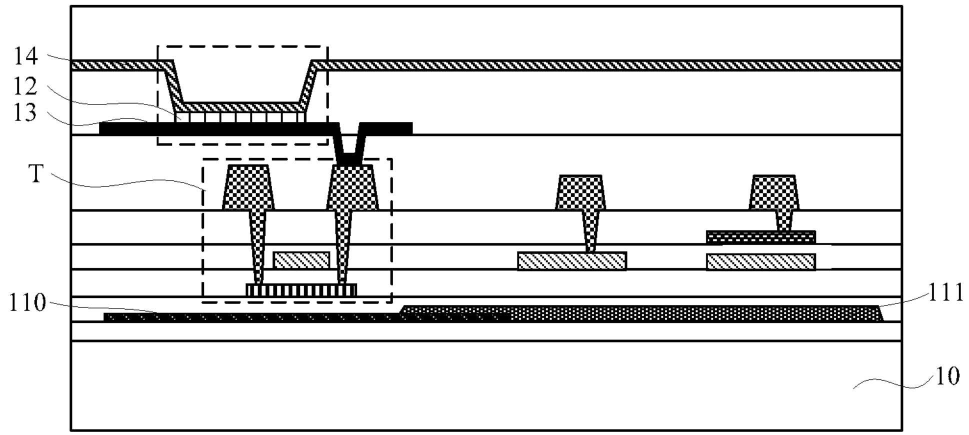
FIG. 7 is a cross-sectional view schematic structural diagram of an exemplary sub-pixel of an exemplary first display area according to various embodiments of the present disclosure.

In the above embodiment, the projection of the second sub-light-shielding layer 111 completely overlapping the projection of the first sub-light-shielding layer 110 is only described as an example. In other embodiments of the present disclosure, the projection of the second sub-light-shielding layer 111 and the projection of the sub-light-shielding layer 110 may also partially overlap each other. FIG. 7 is a cross-sectional view schematic structural diagram of an exemplary sub-pixel of an exemplary first display area according to various embodiments of the present disclosure. As shown in FIG. 7, a projection of a first sub-light-shielding layer 110 covers a projection of a light-emitting structure layer 12, and a projection of a second sub-light-shielding layer 111 covers a projection of at least one transistor of a pixel driving circuit, so that the first sub-light-shielding layer 110 and the second sub-light-shielding layer 111 jointly realize a light-shielding function of a first light-shielding layer 11.

Figure 8:
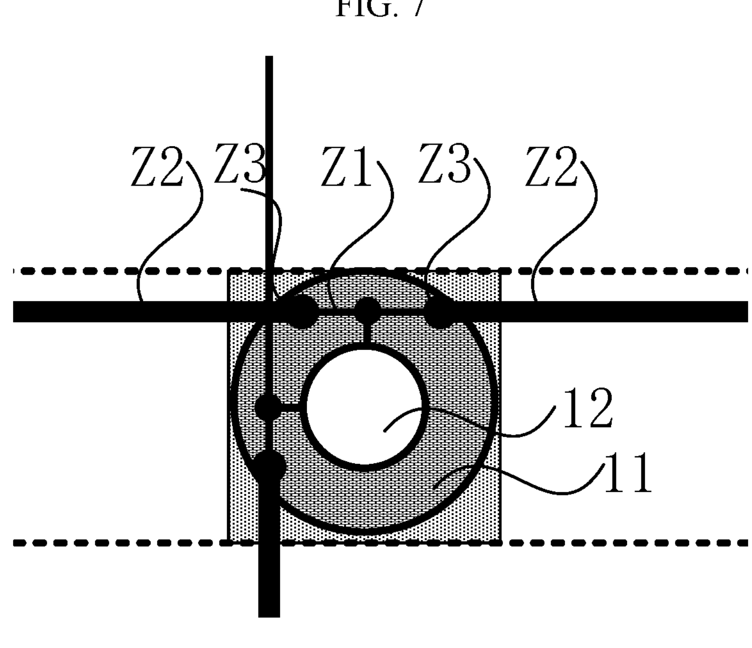
FIG. 8 is a schematic structural diagram of a portion of an exemplary first display area according to various embodiments of the present disclosure.

FIG. 8 is a schematic structural diagram of a portion of an exemplary first display area according to various embodiments of the present disclosure. As shown in FIG. 8, a light non-transmissive area S101 includes light non-transmissive wirings Z1, a light transmissive area S102 includes light transmissive wirings Z2, and the light transmissive wirings Z2 are electrically connected to the light non-transmissive wirings Z1 through via-holes Z3, so as to further improve light transmittance of the light transmissive area S102 by providing the light transmissive wirings Z2 in the light transmissive area S102.

In addition, taking shapes of a projection of a light-emitting structure layer 12 and a projection of a first light-shielding layer 11 being circles as an example, as shown in FIG. 8, the projection of the first light-shielding layer 11 covers projections of the via-holes Z3 in a direction perpendicular to a substrate 10 to avoid disconnection of the via-holes Z3 caused by laser irradiation of the via-holes Z3, which causes abnormal contact between the light non-transmissive wirings Z1 and the light transmissive wirings Z2, and also to avoid a problem that a difference in a height of a bottom film caused by the first light-shielding layer 11 causes sizes and structures of the via-holes Z3 to be abnormal. The light-emitting structure layer 12 is a film layer of a sub-pixel Z.

Optionally, the light non-transmissive wirings Z1 are made of a metal material, and the light transmissive wirings Z2 are made of an indium gallium zinc oxide material. Further optionally, the light non-transmissive wirings Z1 and the light transmissive wirings Z2 connected thereto are gate lines, or the light non-transmissive wirings Z1 and the light transmissive wirings Z2 connected thereto are data lines, and the like.

Optionally, when a first light-shielding layer 11 at least includes a first sub-light-shielding layer 110 and a second sub-light-shielding layer 111, the first sub-light-shielding layer 110 is made of a black light-shielding material, the second sub-light-shielding layer 111 and the first sub-light-shielding layer 110 are stacked one over another, the second sub-light-shielding layer 111 is made of a metal material, a projection of the second sub-light-shielding layer 111 and a projection of the first sub-light-shielding layer 110 at least partially overlap each other in a direction perpendicular to a substrate 10, and only the projection of the second sub-light-shielding layer 111 covers projections of via-holes Z3.

Figure 9:
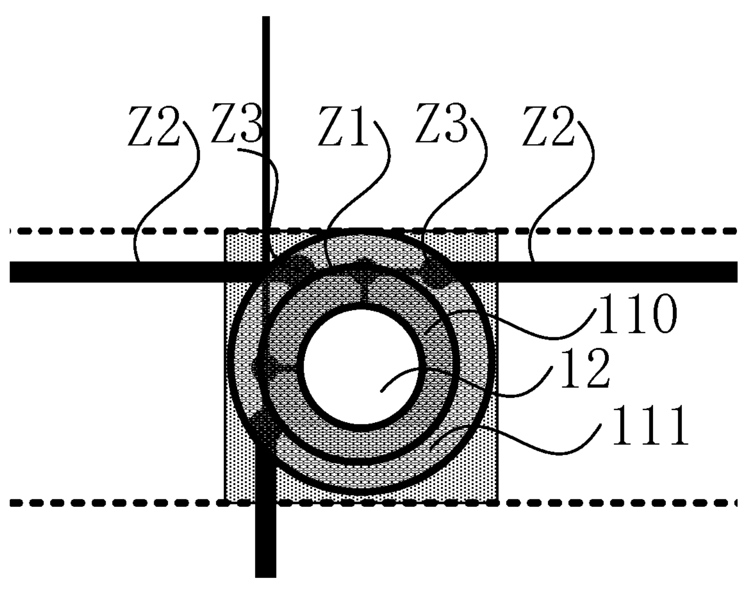
FIG. 9 is a schematic structural diagram of a portion of an exemplary first display area according to various embodiments of the present disclosure.

FIG. 9 is a schematic structural diagram of a portion of an exemplary first display area according to various embodiments of the present disclosure. As shown in FIG. 9, a projection of a first sub-light-shielding layer 110, a projection of a second sub-light-shielding layer 111, and a projection of a light-emitting structure layer 12, are concentric circles. A radius of the projection of the second sub-light-shielding layer 111 is a preset value larger than a radius of the projection of the first sub-light-shielding layer 110, and the radius of the projection of the first sub-light-shielding layer 110 is a preset value larger than a radius of the projection of the light-emitting structure layer 12. Only the projection of the second sub-light-shielding layer 111 covers projections of via-holes Z3. A height difference caused by the first sub-light-shielding layer 110 is filled through the second sub-light-shielding layer 111, and influence of laser on the via-holes Z3 is blocked by the second sub-light-shielding layer 111. The light-emitting structure layer 12 is a film layer of a sub-pixel Z.

In one embodiment of the present disclosure, a second sub-light-shielding layer 111 may be floating, that is, the second sub-light-shielding layer 111 is not connected to any voltage terminal, that is, the second sub-light-shielding layer 111 does not have a potential, although the present disclosure is not limited thereto. In other embodiments, the second sub-light-shielding layer 111 may also be connected to a fixed potential, so that the second sub-light-shielding layer 111 with the fixed potential plays a role of an electrostatic shield to avoid impact on performance of sub-pixels and a pixel driving circuit of the sub-pixels from static electricity.

Optionally, the second sub-light-shielding layer 111 is connected to a power supply voltage terminal PVDD or a reference voltage terminal Vref of a pixel driving circuit of sub-pixels to provide a fixed potential to the second sub-light-shielding layer 111 through the power supply voltage terminal PVDD or the reference voltage terminal Vref.

Figure 10:
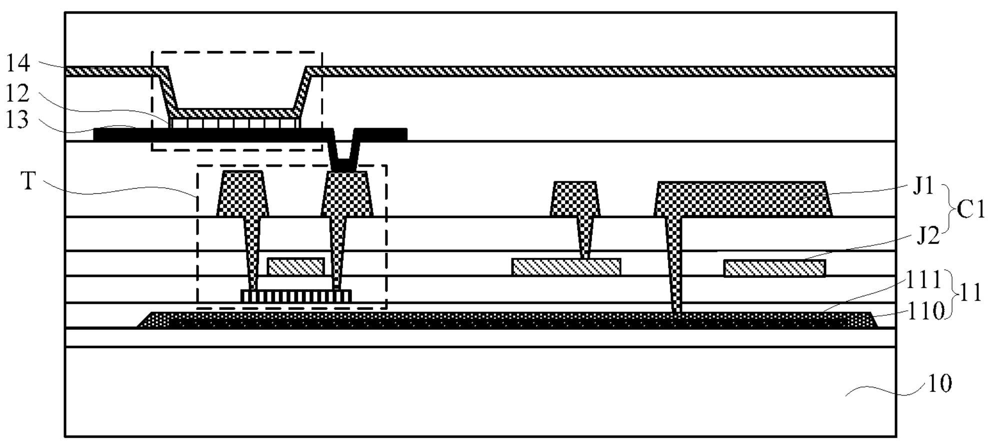
FIG. 10 is a cross-sectional view schematic structural diagram of an exemplary sub-pixel of an exemplary first display area according to various embodiments of the present disclosure.

FIG. 10 is a cross-sectional view schematic structural diagram of an exemplary sub-pixel of an exemplary first display area according to various embodiments of the present disclosure. As shown in FIG. 10, a pixel driving circuit includes a first capacitor C1, the first capacitor C1 includes a first electrode plate J1 and a second electrode plate J2, and the first electrode plate J1 is connected to a power supply voltage terminal PVDD.

In a direction perpendicular to a substrate 10, a projection of a second sub-light-shielding layer 111 overlaps a projection of the first electrode plate J1, and the second sub-light-shielding layer 111 is connected to the power supply voltage terminal PVDD through the first electrode plate J1, such that the second sub-light-shielding layer 111 is connected to the power supply voltage terminal PVDD to have a fixed potential, and the second sub-light-shielding layer 111 and the second electrode plate J2 form a second capacitor, so that the pixel driving circuit has two capacitors connected in series, which can further improve storage capacity of capacitors of the pixel driving circuit.

Figure 11:
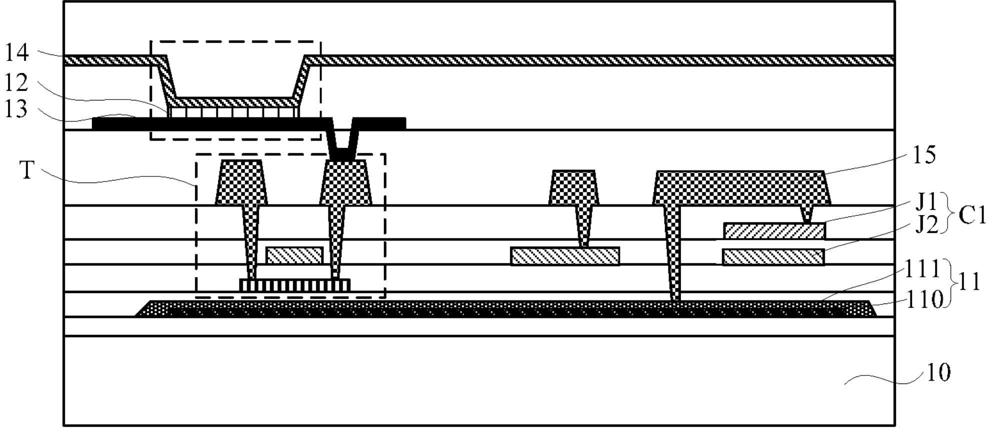
FIG. 11 is a cross-sectional view schematic structural diagram of an exemplary sub-pixel of an exemplary first display area according to various embodiments of the present disclosure.

In structures shown in FIG. 10, the first electrode plate J1 is connected to the power supply voltage terminal PVDD, and the second sub-light-shielding layer 111 is connected to the power supply voltage terminal PVDD through the first electrode plate J1, although the present disclosure is not limited thereto. FIG. 11 is a cross-sectional view schematic structural diagram of an exemplary sub-pixel of an exemplary first display area according to various embodiments of the present disclosure. As shown in FIG. 11, a first electrode plate J1 is connected to a power supply voltage terminal PVDD through a connection structure 15 above the first electrode plate J1, and a second sub-light-shielding layer 111 is connected to the power supply voltage terminal PVDD through the connection structure 15, to implement two storage capacitors.

Figure 12:
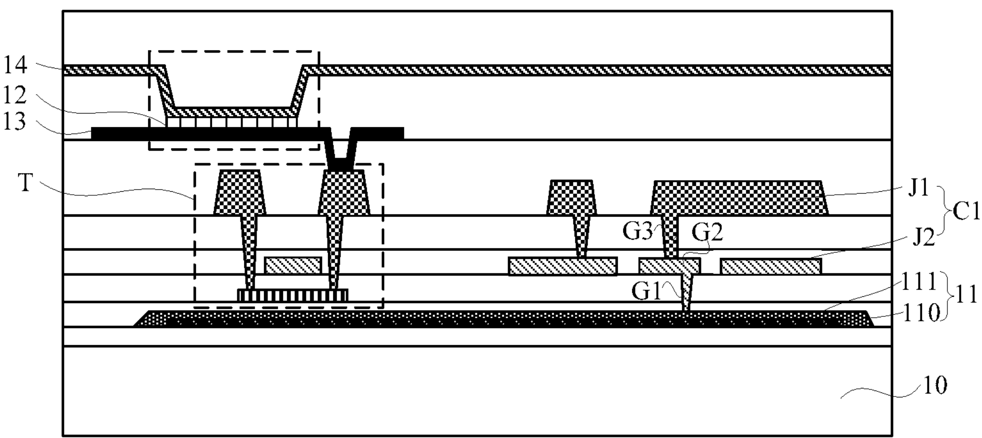
FIG. 12 is a cross-sectional view schematic structural diagram of an exemplary sub-pixel of an exemplary first display area according to various embodiments of the present disclosure.

As shown in FIG. 10, the second sub-light-shielding layer 111 may be connected to the first electrode plate J1 through a via-hole. FIG. 12 is a cross-sectional view schematic structural diagram of an exemplary sub-pixel of an exemplary first display area according to various embodiments of the present disclosure. As shown in FIG. 12, a second sub-light-shielding layer 111 can also be connected to a first electrode plate J1 through at least two via-holes, that is, the second sub-light-shielding layer 111 is connected to the first electrode plate J1 through a first via-hole G1, a connection part G2, and a second via-hole G3. The connection part G2 connects the first via-hole G1 with the second via-hole G3. Optionally, the connection part G2 is provided in a same layer as any metal layer between the second sub-light-shielding layer 111 and the first electrode plate J1.

The second sub-light-shielding layer 111 is connected to the first electrode plate J1 through at least two via-holes, which can avoid a problem that an etching depth is too deep or the etching depth is insufficient when a via hole is etched, and also avoid a problem that more heat generated by forming via-holes in a same film layer may affect performance of the film layer. In addition, using the connection part G2 as a pad to connect the first via-hole G1 with the second via-hole G3 can prevent a problem that alignment accuracy may be insufficient when forming via-holes two times.

Figure 13:
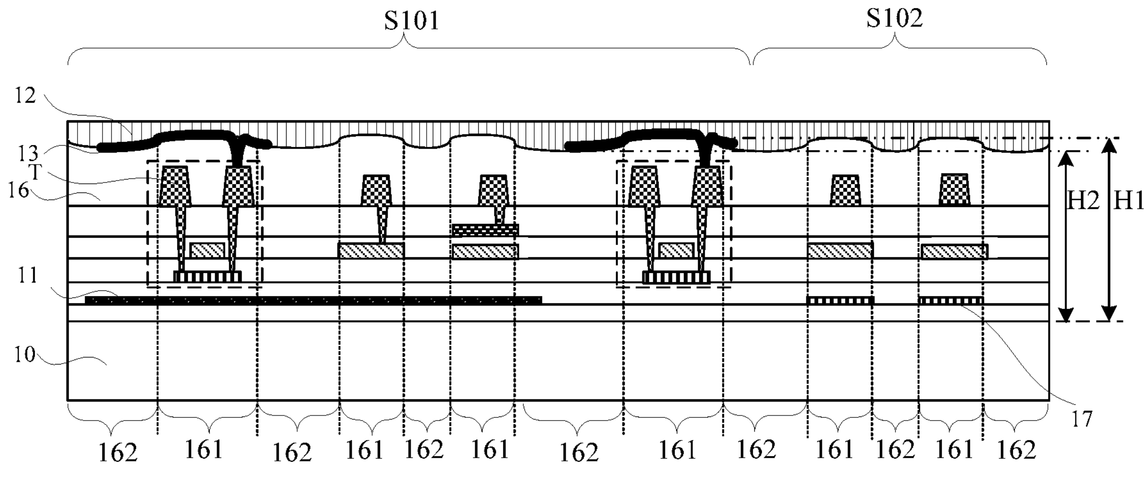
FIG. 13 is a cross-sectional view schematic structural diagram of an exemplary light non-transmissive area and an exemplary light transmissive area according to various embodiments of the present disclosure.

FIG. 13 is a cross-sectional view schematic structural diagram of an exemplary light non-transmissive area and an exemplary light transmissive area according to various embodiments of the present disclosure. As shown in FIG. 13, sub-pixels further include a planarization layer 16 between a pixel driving circuit and a light-emitting structure layer 12. The planarization layer 16 includes a first region 161 and a second region 162. In a direction perpendicular to a substrate 10, a vertical distance H1 from a surface of the first region 161 away from the substrate 10 to the substrate 10 is greater than a vertical distance H2 from a surface of the second region 162 away from the substrate 10 to the substrate 10.

Because driving transistors T, capacitors, wirings, or other structures, may increase a height of a partial region of the planarization layer 16, which is the first region 161, the planarization layer 16 has uneven regions. Light transmissive areas S102 in one embodiment of the present disclosure still have wirings such as gate lines and data lines, so as to realize a connection of wirings in two adjacent light non-transmissive areas S101.

Although a surface of the planarization layer 16 will be planarized when it is made, there is no guarantee that the surface of the planarization layer 16 is a completely flat surface, that is, the surface of the planarization layer 16 will still have uneven areas. After the entire light-emitting structure layer 12 is formed on the uneven planarization layer 16 and the light-emitting structure layer 12 is planarized, a thickness of the light-emitting structure layer 12 of the first region 161 where the planarization layer 16 is raised will be smaller, a thickness of the light-emitting structure layer 12 of the second region 162 where the planarization layer 16 is recessed will be larger. The light-emitting structure layer in FIG. 13 is only a schematic diagram during a manufacturing process, and does not represent an actual schematic diagram of a display panel according to embodiments of the present disclosure. When the light-emitting structure layer 12 of a light transmissive area S102 is removed by laser, if the light-emitting structure layer 12 of the first region 161 and the light-emitting structure layer 12 of the second region 162 are simultaneously irradiated with the laser, the light-emitting structure layer 12 of the second region 162 cannot be completely removed.

In one embodiment of the present disclosure, the light transmissive area S102 includes a second light-shielding layer 17 between the substrate 10 and the planarization layer 16. In the direction perpendicular to the substrate 10, a projection of the second light-shielding layer 17 covers a projection of the first region 161 of the planarization layer 16, such that light transmittance of the first region 161 is smaller than light transmittance of the second region 162 through the second light-shielding layer 17, so that when the light transmissive area S102 is irradiated with laser light, the light-emitting structure layer 12 of the second region 162 and the light-emitting structure layer 12 of the first region 161 can be completely removed at a same time.

In one embodiment of the present disclosure, the second light-shielding layer 17 may be made of a metal material. Optionally, the second light-shielding layer 17 is provided in a same layer as any metal layer between the substrate 10 and the planarization layer 16, although the present disclosure is not limited thereto. In other embodiments, the second light shielding layer 17 may also be made of a black light-shielding material.

Figure 14:
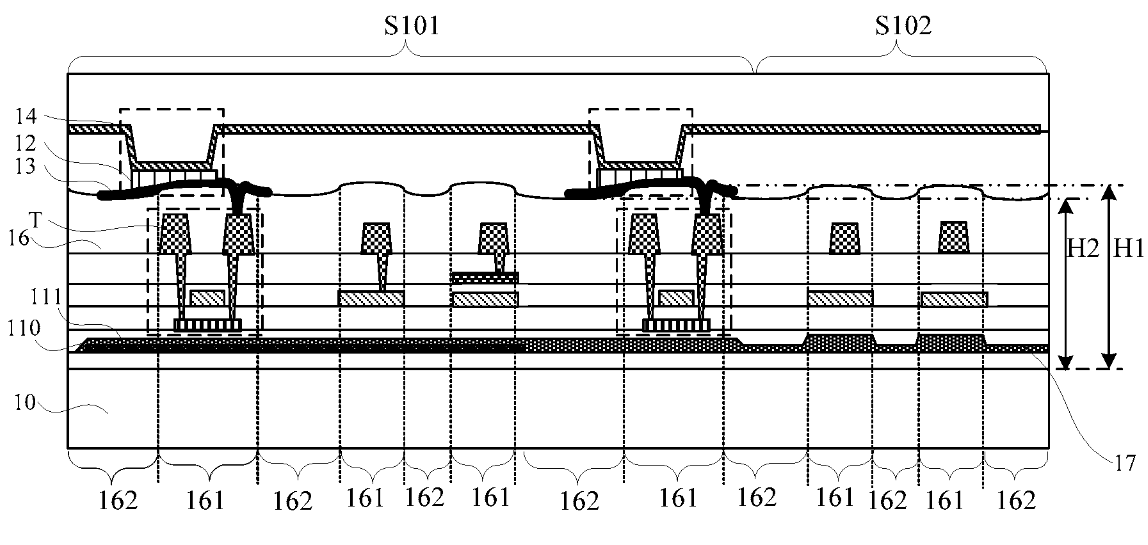
FIG. 14 is a cross-sectional view schematic structural diagram of an exemplary light non-transmissive area and an exemplary light transmissive area according to various embodiments of the present disclosure.

Alternatively, in one embodiment of the present disclosure, the second light-shielding layer 17 may be provided in a same layer as the first light-shielding layer 11, and a material and structures of the second light-shielding layer 17 may be the same as the first light-shielding layer 11, i.e., both are made by using a same process. Alternatively, the second light-shielding layer 17 may be provided in a same layer as a second sub-light-shielding layer 111. FIG. 14 is a cross-sectional view schematic structural diagram of an exemplary light non-transmissive area and an exemplary light transmissive area according to various embodiments of the present disclosure. As shown in FIG. 14, a second light-shielding layer 17 are provided in a same layer as a second sub-light-shielding layer 111, a first region 161 and a second region 162 are both provided with the second light-shielding layer 17, and a thickness of the second light-shielding layer 17 of the first region 161 in a direction perpendicular to a substrate 10 is greater than a thickness of the second light-shielding layer 17 of the second region 162 in the direction perpendicular to the substrate 10.

In embodiments of the present disclosure, a second light-shielding layer 17 may be provided only corresponding to a first region 161 in a light transmissive area S102, or corresponding to a first region 161 and a second region 162 in a light transmissive area S102, or corresponding to other regions such as a first region 161 in a light non-transmissive area S101, or corresponding to a first region 161 and a second region 162 in a light non-transmissive area S101, although the present disclosure is not limited thereto.

Figure 15:
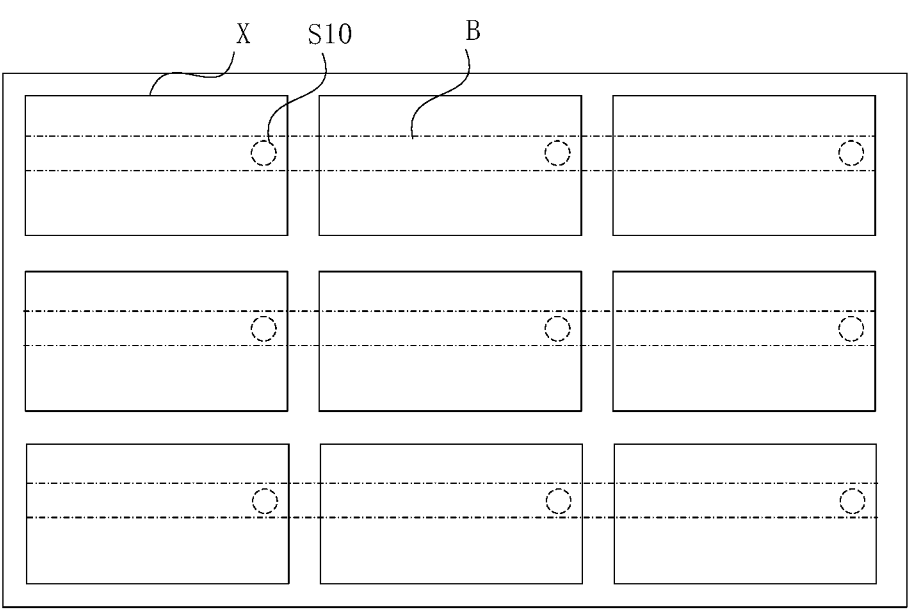
FIG. 15 is a schematic structural diagram of multiple exemplary display panels according to various embodiments of the present disclosure.

FIG. 15 is a schematic structural diagram of multiple exemplary display panels according to various embodiments of the present disclosure. As shown in FIG. 15, when display panels are manufactured, production of a plurality of display panels X are completed on a larger substrate, and then the larger substrate is cut to form individual display panels X. When manufacturing display panels X, to simplify a process and speed up a manufacturing process, laser is used to scan a first display area S10 of each display panel X along a laser scanning area B (an area between dotted lines as shown in FIG. 15).

Figure 16:
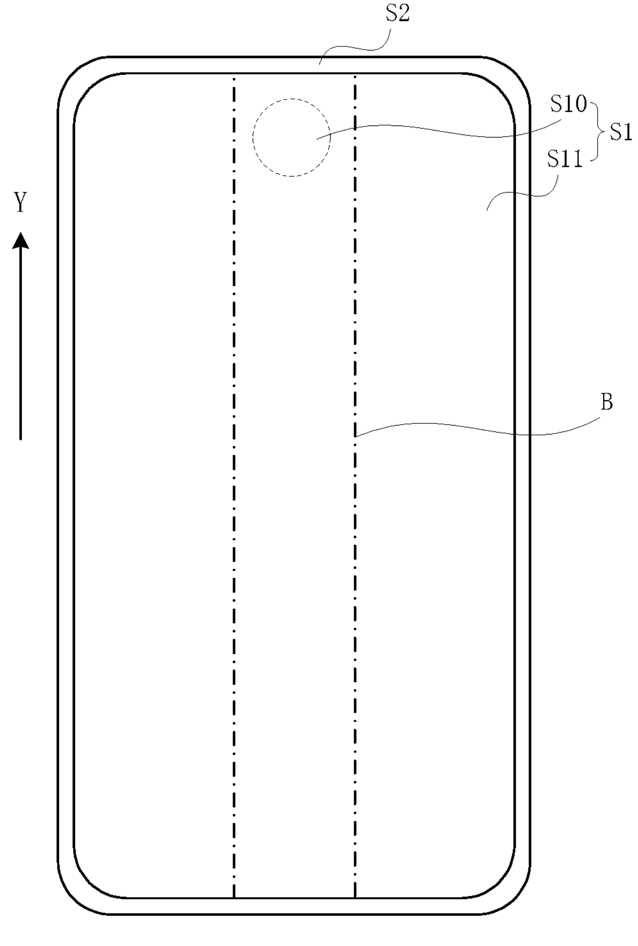
FIG. 16 is a top view schematic structural diagram of an exemplary display panel according to various embodiments of the present disclosure.

FIG. 16 is a top view schematic structural diagram of an exemplary display panel according to various embodiments of the present disclosure. As shown in FIG. 16, an exemplary display panel includes a laser scanning area B, and the laser scanning area B includes a first display area S10 and a partial area of a second display area S11.

Figure 17:
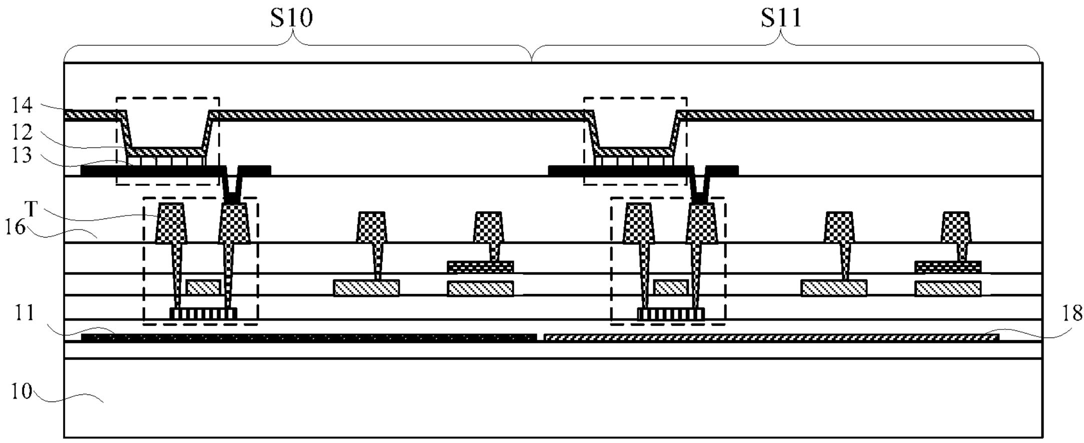
FIG. 17 is a cross-sectional view schematic structural diagram of an exemplary first display area and an exemplary second display area according to various embodiments of the present disclosure.

FIG. 17 is a cross-sectional view schematic structural diagram of an exemplary first display area and an exemplary second display area according to various embodiments of the present disclosure. A second display area S11 does not include light transmissive areas, or there is no need to remove a light-emitting structure layer 12 in a partial area of a second display area S11. Based on this, as shown in FIG. 17, a sub-pixel in a partial area of a second display area S11 includes a third light-shielding layer 18 between a substrate 10 and a pixel driving circuit, which is a driving transistor T. In a direction perpendicular to the substrate 10, a projection of the third light-shielding layer 18 covers a projection of a light-emitting structure layer 12 in the sub-pixel and a projection of at least one transistor of the pixel driving circuit in the sub-pixel, to avoid influence on structures and performance of the sub-pixel in the partial area of the second display area S11 from laser light.

Figure 18:
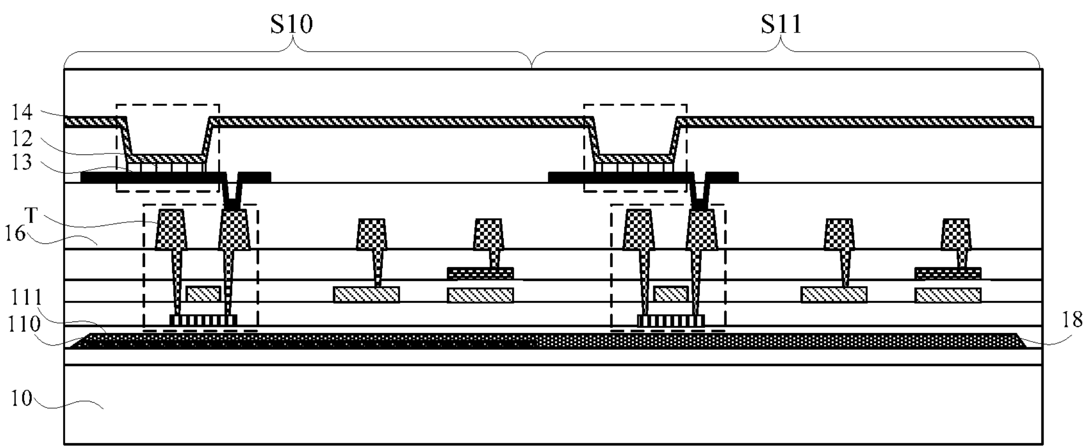
FIG. 18 is a cross-sectional view schematic structural diagram of an exemplary first display area and an exemplary second display area according to various embodiments of the present disclosure.

Optionally, the third light-shielding layer 18 and a first light-shielding layer 11 are disposed in a same layer, and a material and structures of the third light-shielding layer 18 may be the same as a material and structures of the first light-shielding layer 11, that is, the third light-shielding layer 18 and the first light-shielding layer 11 are manufactured in a same process. FIG. 18 is a cross-sectional view schematic structural diagram of an exemplary first display area and an exemplary second display area according to various embodiments of the present disclosure. Further optionally, as shown in FIG. 18, a third light-shielding layer 18 and a second sub-light-shielding layer 111 are disposed in a same layer to simplify process steps, although the present disclosure is not limited thereto. In other embodiments, the third light-shielding layer 18 may also be provided in a different layer from a first light-shielding layer 11, such as the third light-shielding layer 18 is provided in a same layer as any metal layer between a substrate 10 and a pixel driving circuit, which is a driving transistor T.

Figure 19:
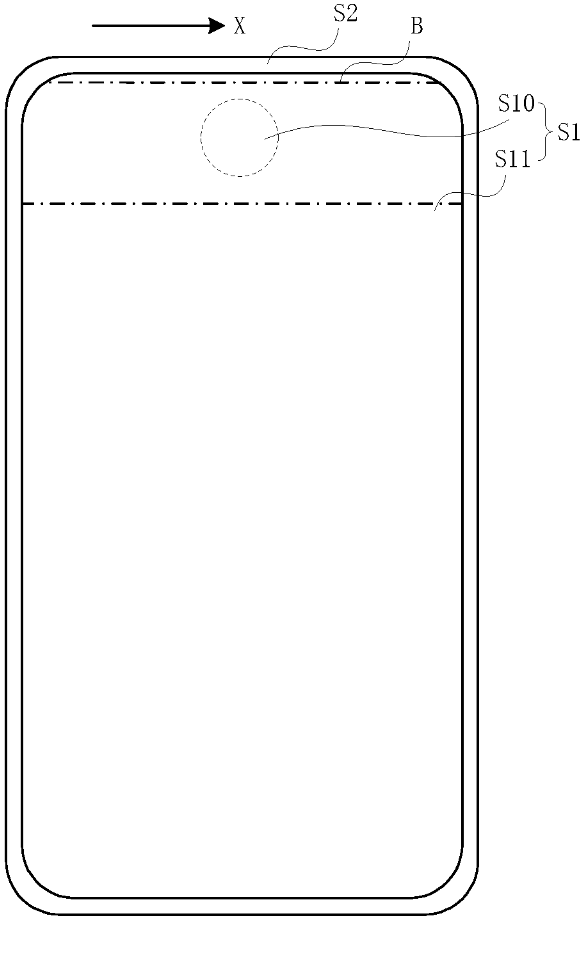
FIG. 19 is a top view schematic structural diagram of an exemplary display panel according to various embodiments of the present disclosure.

As shown in FIG. 16, a laser scanning area B penetrates through a display panel along a first direction Y. FIG. 19 is a top view schematic structural diagram of an exemplary display panel according to various embodiments of the present disclosure. As shown in FIG. 19, a laser scanning area B penetrates through a display panel along a second direction X, and the first direction Y is perpendicular to the second direction X. Optionally, the first direction Y and the second direction X are respectively parallel to two sides of a display panel.

Figure 20:
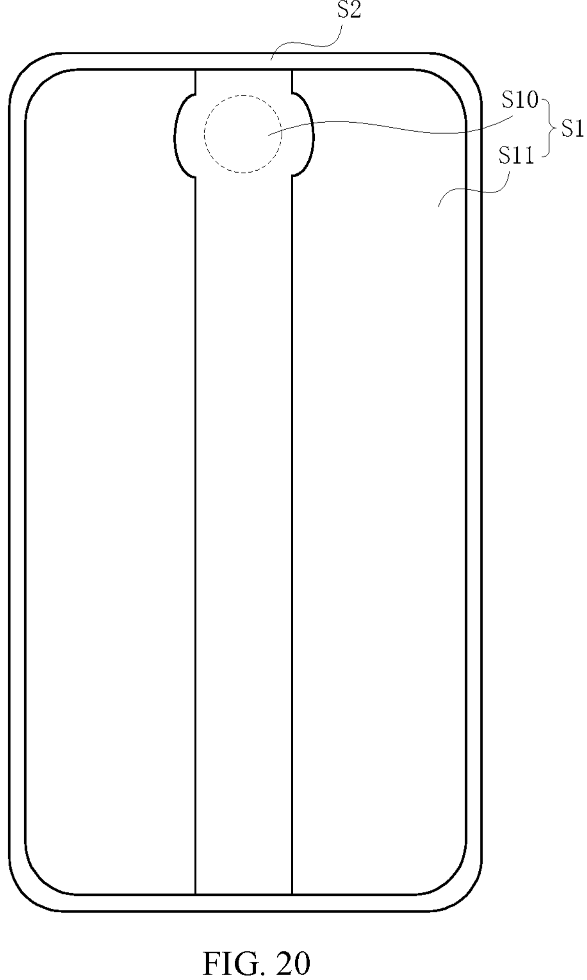
FIG. 20 is a top view schematic structural diagram of an exemplary display panel according to various embodiments of the present disclosure.

In embodiments of the present disclosure, as shown in FIGS. 16 and 19, a laser scanning area B is a strip-shaped area. FIG. 20 is a top view schematic structural diagram of an exemplary display panel according to various embodiments of the present disclosure. Alternatively, as shown in FIG. 20, a laser scanning area B corresponding to a partial area of a second display area S11 is a strip-shaped area, and a laser scanning area B corresponding to a first display area S10 is a circular area, so as to avoid that structures and performance of sub-pixels in a preset area surrounding the first display area S10 are affected, due to scanning offset, when laser sweeps back and forth multiple times in the first display area S10.

Although laser will move from the second display area S11 to the first display area S10, it will sweep back and forth multiple times in the first display area S10 to remove a light-emitting structure layer 12 of light transmissive areas S102 in the first display area S10. Light-shielding ability of a third light-shielding layer 18 in the second display area S11 may be less than light-shielding ability of a first light-shielding layer 11 in the first display area S10.

Optionally, in one embodiment of the present disclosure, in a direction perpendicular to a substrate 10, a thickness of the first light-shielding layer 11 is greater than a thickness of the third light-shielding layer 18, and/or a projected area of the first light-shielding layer 11 is larger than a projection area of the third light-shielding layer 18, to reduce usage of light-shielding materials and reduce manufacturing cost.

In addition, in another embodiment of the present disclosure, in a direction of moving from the second display area S11 to the first display area S10, a spot diameter of laser light may be gradually increased to reduce influence of the laser light on structures and performance of sub-pixels in the second display area S11. A projection area of the third light-shielding layer 18 in the direction perpendicular to the substrate 10 gradually decreases in a direction away from the first display area S10, and/or a thickness of the third light-shielding layer 18 in the direction perpendicular to the substrate 10 gradually decreases to reduce usage of light-shielding materials and reduce manufacturing costs.

Figure 21:
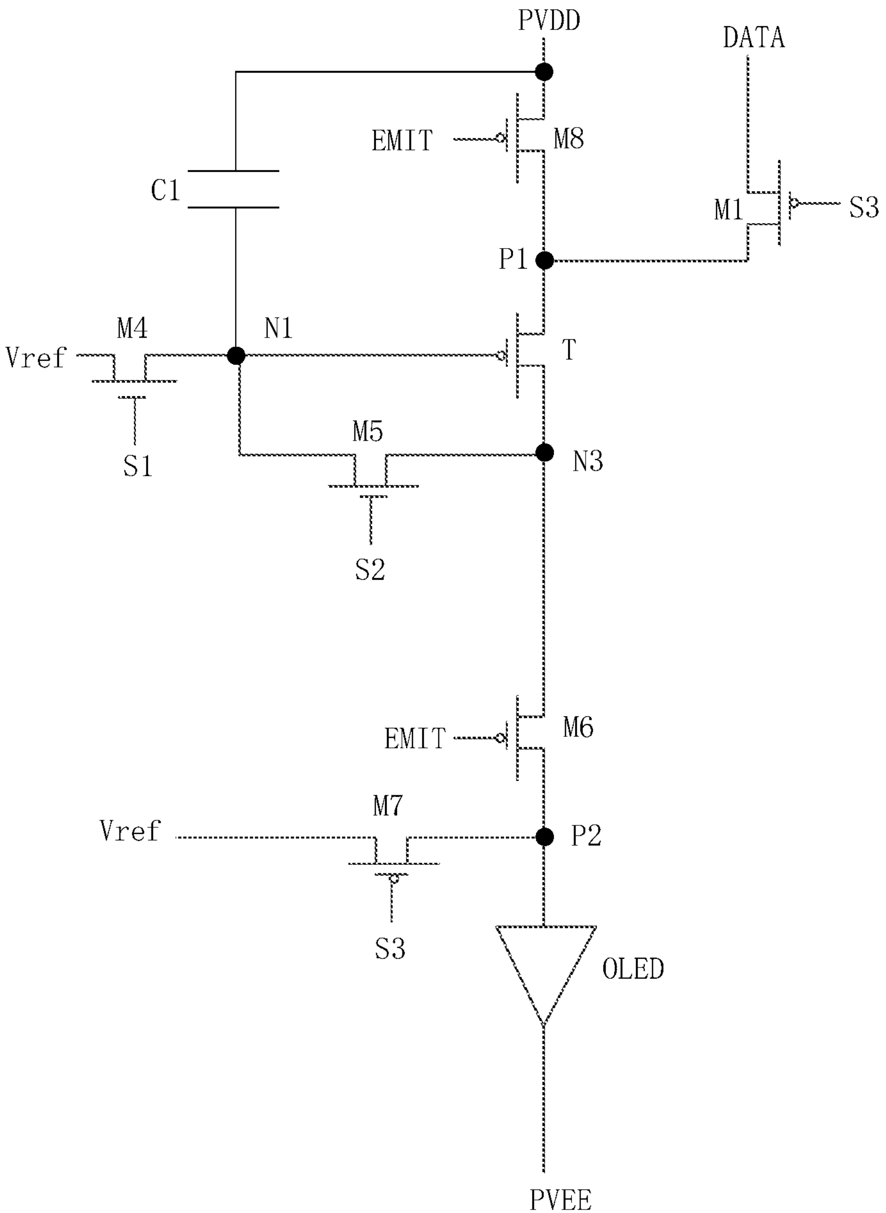
FIG. 21 is a schematic structural diagram of an exemplary pixel driving circuit according to various embodiments of the present disclosure.

FIG. 21 is a schematic structural diagram of an exemplary pixel driving circuit according to various embodiments of the present disclosure. As shown in FIG. 21, an exemplary pixel driving circuit includes a driving transistor T, a first transistor M4, a second transistor M5, a third transistor M6, a fourth transistor M7, a fifth transistor M8, a sixth transistor M1, and a first capacitor C1.

A second terminal of the first transistor M4 is connected to a gate of the driving transistor T and a second terminal of the second transistor M5, a gate of the first transistor M4 is connected to a first control terminal S1, a first terminal of the second transistor M5 is connected to a second terminal of the driving transistor T, a gate of the second transistor M5 is connected to a second control terminal S2, the second terminal of the driving transistor T is connected to a first terminal of the third transistor M6, a second terminal of the third transistor M6 is connected to a first terminal of a light-emitting element OLED, a gate of the third transistor M6 is connected to a third control terminal EMIT, and a second terminal of the light-emitting element OLED is connected to a first power voltage terminal PVEE.

A second terminal of the fourth transistor M7 is connected to the first terminal of the light-emitting element OLED, a first terminal of the fourth transistor M7 is connected to a reference voltage terminal Vref, a gate of the fourth transistor M7 is connected to a fifth control terminal S3, a first terminal of the fifth transistor M8 is connected to a second power supply voltage terminal PVDD, a second terminal of the fifth transistor M8 is connected to a first terminal of the driving transistor T, a gate of the fifth transistor M8 is connected to the third control terminal EMIT, a first terminal of the sixth transistor M1 is connected to a data signal voltage terminal DATA, a second terminal of the sixth transistor M1 is connected to the first terminal of the driving transistor T, a gate of the sixth transistor M1 is connected to the fifth control terminal S3, one terminal of the first capacitor C1 is connected to the second power supply voltage terminal PVDD, and a second terminal of the first capacitor C1 is connected to the gate of the driving transistor T.

In one embodiment of the present disclosure, the pixel driving circuit shown in FIG. 21 is only used as an example for description, although the present disclosure is not limited thereto. The light-emitting element OLED includes an anode 13, a light-emitting structure layer 12, and a cathode 14. A scanning transistor includes the first transistor M4, the second transistor M5, and the sixth transistor M1.

Optionally, in one embodiment of the present disclosure, transistors in the pixel driving circuit are all low-temperature polysilicon thin film transistors. At least one transistor covered by a projection of a first light-shielding layer 11 includes the driving transistor T and/or the scanning transistor, to prevent laser from affecting performance of the driving transistor T and/or the scanning transistor, although the present disclosure is not limited thereto.

In other embodiments, some transistors in the pixel driving circuit are low-temperature polysilicon thin film transistors, and some transistors are metal oxide thin film transistors, including the first transistor M4 and the second transistor M5. That is, the first transistor M4 and the second transistor M5 are metal oxide thin film transistors. In other embodiments of the present disclosure, transistors other than the first transistor M4 and the second transistor M5 may also be metal oxide thin film transistors.

Since metal oxide thin film transistors are more sensitive to laser, that is, the laser has a greater influence on performance of the metal oxide thin film transistors, in a direction perpendicular to a substrate 10, a projection of a first light-shielding layer 11 covers projections of the metal oxide thin film transistors.

Figure 22:
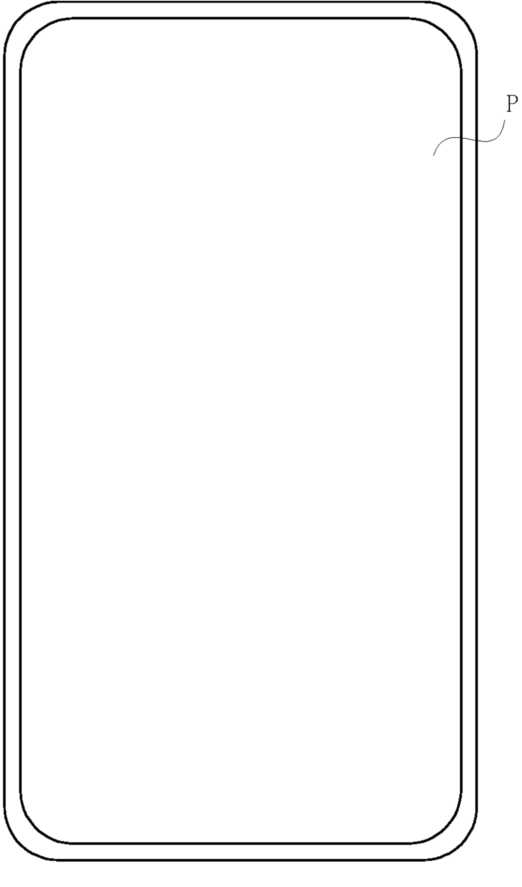
FIG. 22 is a schematic structural diagram of an exemplary display device according to various embodiments of the present disclosure.

One embodiment of the present disclosure further provides an exemplary display device. FIG. 22 is a schematic structural diagram of an exemplary display device according to various embodiments of the present disclosure. As shown in FIG. 22, an exemplary display device P includes a display panel provided in any of the foregoing embodiments. The display device P in embodiments of the present disclosure includes but is not limited to a smart phone, a tablet computer, a digital camera, and the like.

Compared with existing technologies, the technical solutions provided by the present disclosure have following advantages.

In a display panel and a display device provided by the present disclosure, sub-pixels in light non-transmissive areas include a first light-shielding layer, a pixel driving circuit, and a light-emitting structure layer, which are sequentially disposed on a substrate, and in a direction perpendicular to the substrate, a projection of the first light-shielding layer covers a projection of the light-emitting structure layer and a projection of at least one transistor of the pixel driving circuit. When a first display area is irradiated with laser and the light-emitting structure layer in light transmissive areas is removed, it will not affect the light-emitting structure layer in the light non-transmissive areas and the at least one transistor of the pixel driving circuit in the light non-transmissive areas, so that large-area laser can be used to remove the light-emitting structure layer and other film layers in the first display area, thereby improving production efficiency of the display panel and the display device.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. The scope of the present disclosure is defined by the appended claims.

What is claimed is:

1. A display panel, comprising:

a substrate;

a pixel driving circuit;

a planarization layer arranged on a side of the pixel driving circuit away from the substrate, including:

a plurality of first regions; and a plurality of second regions, the first regions and the second regions being in a direction perpendicular to the substrate, a vertical distance from top surfaces of the first regions of the planarization layer away from the substrate to the substrate being greater than a vertical distance from top surfaces of the second regions of the planarization layer away from the substrate to the substrate; and a display area including a second light-shielding layer arranged between the substrate and the planarization layer, wherein:

the display panel includes a first display area, and the first display area includes a light transmissive area and a light non-transmissive area;

in the light transmissive area, there are at least one first region and at least one second region, in a direction perpendicular to the substrate, a projection of the second light-shielding layer at least partially overlaps with a projection of the at least one first region but does not overlap with a projection of the at least one second region, or a thickness of a portion of the second light-shielding layer overlapping with the at least one first region is larger than a thickness of a portion of the second light-shielding layer overlapping with the at least one second region; and the display panel further includes a first light-shielding layer, and in the light non-transmissive area, there are at least one first region and at least one second region, in the direction perpendicular to the substrate, a projection of the first light-shielding layer overlaps with both the projection of the at least one first region and the projection of the at least one second region; or in the light non-transmissive region, in the direction perpendicular to the substrate, the projection of the second light-shielding layer overlaps with both the projection of the at least one first region and the projection of the at least one second region.

2. The display panel according to claim 1, wherein:

the second light-shielding layer is provided in a same layer as any metal layer between the substrate and the planarization layer.

3. The display panel according to claim 1, wherein the projection of the first light-shielding layer partially overlapping with a projection of the pixel driving circuit.

4. The display panel according to claim 3, wherein:

the first light-shielding layer and the second-shielding layer are arranged on a same layer.

5. The display panel according to claim 3, wherein:

the first light-shielding layer includes a first sub-light-shielding layer, a material of the first sub-light-shielding layer including a black light-shielding material.

6. The display panel according to claim 5, wherein:

the first light-shielding layer further includes a second sub-light-shielding layer arranged on a side of the first sub-light-shielding layer away from the substrate, a material of the second sub-light-shielding layer including a metal material, a projection of the second sub-shielding-layer overlapping with a projection of the first sub-shielding layer in the direction perpendicular to the substrate.

7. The display panel according to claim 6, wherein:

a part of the first sub-light-shielding layer does not overlap with the second sub-light-shielding layer in the direction perpendicular to the substrate.

8. The display panel according to claim 6, wherein:

the second sub-light-shielding layer is connected to a power supply voltage or a reference voltage of the display panel.

9. The display panel according to claim 5, wherein:

the first light-shielding layer further includes a second sub-light-shielding layer; and the pixel driving circuit includes a first capacitor including:

a first electrode plate connected to a power supply voltage; and a second electrode plate, the second sub-light-shielding layer and the second electrode plate forming a second capacitor.

10. The display panel according to claim 9, wherein:

the second sub-light-shielding layer is connected to the first electrode plate through a first via-hole, a connection part, and a second via-hole; and the connection part connects the first via-hole and the second via-hole; and the connection part is arranged on a same layer with any one metal layer arranged between the second sub-light-shielding layer and the first electrode plate.

11. A display panel, comprising:

a substrate;

a pixel driving circuit;

a light-emitting structure layer; and a display area including:

a first display area including a first light-shielding layer; and a second display area including a third light-shielding layer, in a direction perpendicular to the substrate:

a projection of the first light-shielding layer at least partially overlapping with a projection of the pixel driving circuit; and a projection of the third light-shielding layer at least partially overlapping with the projection of the pixel driving circuit and the projection of the first light-shielding layer, wherein:

the first display area includes a light transmissive area and a light non-transmissive area and the second display area does not include a light transmissive area;

the light non-transmissive area of the first display area and the third display area both include the light-emitting structure layer;

the light non-transmissive area of the first display area includes the first light-shielding layer, and in the direction perpendicular to the substrate, the projection of the first light-shielding layer overlaps with a projection of the light-emitting structure layer in the first display area;

the light transmissive area of the first display includes a second light-shielding layer, and in the direction perpendicular to the substrate, a projection of the second light-shielding layer does not overlap with the projection of the light-emitting structure layer in the first display area;

the third display area is located in an area adjacent to the first display area and the second display area, and in the direction perpendicular to the substrate, a projection of the third display area overlaps with a projection of the light-emitting structure layer in the second display area; and in the direction perpendicular to the substrate, a thickness of the first light-shielding layer is greater than a thickness of the third light-shielding layer, and/or a projection area of the first light-shielding layer is greater than a projection area of the third light-shielding layer.

12. The display panel according to claim 11, wherein in a direction moving away from the first display area to the second display area, a projection area of the another light-shielding layer in the direction perpendicular to the substrate decreases gradually; and/or in the direction moving away from the first display area to the second display area, a thickness of the another light-shielding layer in the direction perpendicular to the substrate decreases gradually.

13. The display panel according to claim 11, wherein:

the first light-shielding layer includes a first sub-light-shielding layer, a material of the first sub-light-shielding layer being a black light-shielding material.

14. The display panel according to claim 13, wherein:

the first light-shielding layer further includes a second sub-light-shielding layer arranged on a side of the first sub-light-shielding layer away from the substrate;

the second sub-light-shielding layer includes a metal material; and in the direction perpendicular to the substrate, a projection of the second sub-light-shielding layer partially overlaps with a projection of the first sub-light-shielding layer.

15. The display panel according to claim 14, wherein:

in the direction perpendicular to the substrate, a part of the first sub-light-shielding layer does not overlap with the second sub-light-shielding layer.

16. The display panel according to claim 14, wherein:

the second sub-light-shielding layer is connected to a power supply voltage or a reference voltage of the display panel.

17. The display panel according to claim 13, wherein:

the first light-shielding layer further includes a second sub-light-shielding layer; and the pixel driving circuit includes a first capacitor including:

a first electrode plate connected to the power supply voltage; and a second electrode plate, the second sub-light-shielding layer and the second electrode plate forming a second capacitor.

18. The display panel according to claim 17, wherein:

the second sub-light-shielding layer is connected to the first electrode plate through a first via-hole, a connection part, and a second via-hole;

the connection part connects the first via-hole and the second via-hole; and the connection part is arranged on a same layer with any one metal layer between the second sub-light-shielding layer and the first electrode plate.

19. A display device, comprising a display panel including:

a substrate;

a pixel driving circuit;

a planarization layer arranged on a side of the pixel driving circuit away from the substrate, including:

a plurality of first regions; and a plurality of second regions, the first regions and the second regions being in a direction perpendicular to the substrate, a vertical distance from top surfaces of the first regions of the planarization layer away from the substrate to the substrate being greater than a vertical distance from top surfaces of the second regions of the planarization layer away from the substrate to the substrate; and a display area including a second light-shielding layer arranged between the substrate and the planarization layer, wherein:

the display panel includes a first display area, and the first display area includes a light transmissive area and a light non-transmissive area;

in the light transmissive area, there are at least one first region and at least one second region, in a direction perpendicular to the substrate, a projection of the second light-shielding layer at least partially overlaps with a projection of the at least one first region but does not overlap with a projection of the at least one second region, or a thickness of a portion of the second light-shielding layer overlapping with the at least one first region is larger than a thickness of a portion of the second light-shielding layer overlapping with the at least one second region; and the display panel further includes a first light-shielding layer, and in the light non-transmissive area, there are at least one first region and at least one second region, in the direction perpendicular to the substrate, a projection of the first light-shielding layer overlaps with both the projection of the at least one first region and the projection of the at least one second region; or in the light non-transmissive region, in the direction perpendicular to the substrate, the projection of the second light-shielding layer overlaps with both the projection of the at least one first region and the projection of the at least one second region.

* * * * *